United States Patent
Arai et al.

(12) 
(10) Patent No.: US 6,514,803 B1
(45) Date of Patent: Feb. 4, 2003

(54) PROCESS FOR MAKING AN AMORPHOUS SILICON THIN FILM SEMICONDUCTOR DEVICE

(75) Inventors: Michio Arai, Tokyo (JP); Isamu Kobori, Kanagwa (JP)

(73) Assignees: TDK Corporation, Tokyo (JP); Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 08/963,588

(22) Filed: Nov. 4, 1997

Related U.S. Application Data

(63) Continuation of application No. 08/361,366, filed on Dec. 22, 1994, now abandoned.

(30) Foreign Application Priority Data

Dec. 22, 1993 (JP) .............................................. 5-323909

(51) Int. Cl.⁷ .............................................. H01L 21/84
(52) U.S. Cl. ...................... 438/164; 438/162; 438/166; 438/486
(58) Field of Search .......................... 437/40 TFT, 913, 437/41 TFT, 101; 148/DIG. 150, DIG. 1; 438/164, 162, 163, 165, 166, 479, 482, 486, 480

(56) References Cited

U.S. PATENT DOCUMENTS

| | | |
|---|---|---|
| 4,007,294 A | 2/1977 | Woods et al. |
| 4,027,380 A | 6/1977 | Deal et al. |
| 4,625,224 A | 11/1986 | Nakagawa et al. |
| 4,683,144 A * | 7/1987 | Nishimura et al. ......... 438/485 |
| 5,116,771 A * | 5/1992 | Karulkar ...................... 437/21 |
| 5,225,356 A * | 7/1993 | Omura et al. .................. 437/21 |

FOREIGN PATENT DOCUMENTS

| | | |
|---|---|---|
| JP | 61264720 | * 11/1986 |
| JP | 62-158872 | 7/1987 |
| JP | 66919/1988 | 3/1988 |
| JP | 0180020 | * 3/1989 |
| JP | 03297130 | * 12/1991 |
| JP | 4-144123 | 5/1992 |
| JP | 04252023 | * 9/1992 |
| JP | 04324628 | * 11/1992 |
| JP | 5-55581 | 3/1993 |

OTHER PUBLICATIONS

"Low–Temperature Polysilicon TFT with Gate Oxide Grown by High–Pressure Oxidation", Mitra et al, IEEE Electron Device Letters, vol. 12, No. 7, Jul. 1991, pp. 390–392.

* cited by examiner

*Primary Examiner*—Michael Trinh
(74) *Attorney, Agent, or Firm*—Arent Fox Kintner Plotkin, Kahn, PLLC

(57) ABSTRACT

In a thin film semiconductor device having a substrate (1), an active layer (3, 6, 9), a gate insulation layer (4), and a gate electrode (5), said active layer is produced through the steps of producing an amorphous silicon layer on said substrate through a CVD process by using a gas made up of poly silane $Si_nH_{2(n+1)}$, where n is an integer, and chloride gas, and effecting solid phase growth to produce said amorphous silicon layer. The addition of chlorine to the CVD gas used in producing the amorphous silicon layer makes it possible to produce the amorphous silicon layer at a lower temperature with a rapid growth rate. A thin film semiconductor device thus produced has the advantages of high mobility and low threshold voltage.

9 Claims, 7 Drawing Sheets

PROCESS FOR MAKING AN AMORPHOUS SILICON THIN FILM SEMICONDUCTOR DEVICE

This application is a continuation of application Ser. No. 08/361,366 filed Dec.22, 1994 now abandoned.

BACKGROUND OF THE INVENTION

The present invention relates to a method for producing a thin film semiconductor device, and to a device produced by said method. In particular, it relates to such a method and a device in which an amorphous silicon layer is deposited on a substrate which is subject to crystallization through an annealing process at lower temperature and high growth rate.

Conventionally, a poly silicon layer, which is used for a thin film transistor, is produced through the steps of producing an amorphous silicon layer, and crystallizing said layer through a laser annealing process or a thermal solid phase growth process. The characteristics of the crystallized poly silicon thus produced depend upon a method used for producing said amorphous silicon.

Conventionally, an amorphous silicon layer is produced through a low pressure CVD process (LPCVD) or a plasma CVD process (P-CVD) using as the raw material $SiH_4$, or $Si_2H_6$. The characteristics of a thin film transistor made using said amorphous silicon layer, or the mobility in the layer, are better when the amorphous silicon layer is produced at lower temperature, and at higher growth rate, or speed, of the layer.

In comparing P-CVD with LPCVD, P-CVD process has the disadvantage as compared with LPCVD process in that the former introduces impurity like oxygen into the amorphous layer due to activation of the gas, including oxygen, in a reaction chamber, although the former produces an amorphous layer at lower temperature than the latter, and therefore, it is impossible for P-CVD process to provide better characteristics than LPCVD process (IEEE ELECTRON DEVICE LETTERS, VOL. 12, No. 7, July 1991). Further, since the process shown in that article uses high pressure oxygen to provide an oxidized layer on an amorphous layer for a gate insulation layer, it would be possible that the amorphous layer includes more undesired oxygen.

As another prior art, the laid open JP patent 66919/1988 shows a process for producing an amorphous layer by using a gas comprising $Si_2Cl_6+SiH_4$, or $Si_2Cl_6+Si_2H_6$. However, the process is not a mere thermal dissolution process, but an optical dissolution process and/or a plasma discharge process, and therefore, the apparatus used to carry out this process is complicated, and producing cost would be high. The quality of the layer produced through said process is not shown in that publication.

Said optical dissolution process has the disadvantage that the amorphous silicon layer is produced only in an area where light illuminates on a substrate.

Said plasma dissolution process also has the disadvantage that producing efficiency is low since only one substrate is placed in vertical direction on a board holder in a heater. Further, since the operating chamber must be conductive for applying voltage for producing the plasma, and it is actually made of stainless steel, metal pollution of the gas, and therefore the amorphous layer, is inevitable. Further, since the gas material has undesired etching ability, it is difficult to produce an amorphous silicon layer through said process.

SUMMARY OF THE INVENTION

It is an object, therefore, of the present invention to overcome the disadvantages and limitations of a process for producing a prior thin film semiconductor device by providing a new and improved process for producing a thin film semiconductor device.

It is also an object of the present invention to provide a method for producing a thin film semiconductor device by using a non-conductive chamber.

It is also an object of the present invention to provide a method for producing a thin film semiconductor device by using a quartz crystal chamber.

Another object of the present invention is to provide a method for producing a thin film semiconductor device with high producing efficiency, and excellent characteristics.

Another object of the present invention is to provide a semiconductor device produced by said method, and having excellent characteristics in particular high mobility and low threshold voltage.

The above and other objects are attained by a method for producing a thin film semiconductor device comprising the steps of producing an amorphous silicon layer on a substrate through a CVD process with gas comprising a silane $Si_nH_{2(n+1)}$, where n is an integer, having chlorine $Cl_2$ added thereto, and effecting solid phase growth of said amorphous silicon layer thereby providing active silicon layer.

A semiconductor device thus produced has an active silicon layer which includes chlorine in a concentration in the range of about $2\times10^{17}/cm^3$ to $5\times10^{21}$ atom/cm$^3$, and has high mobility and low threshold voltage.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
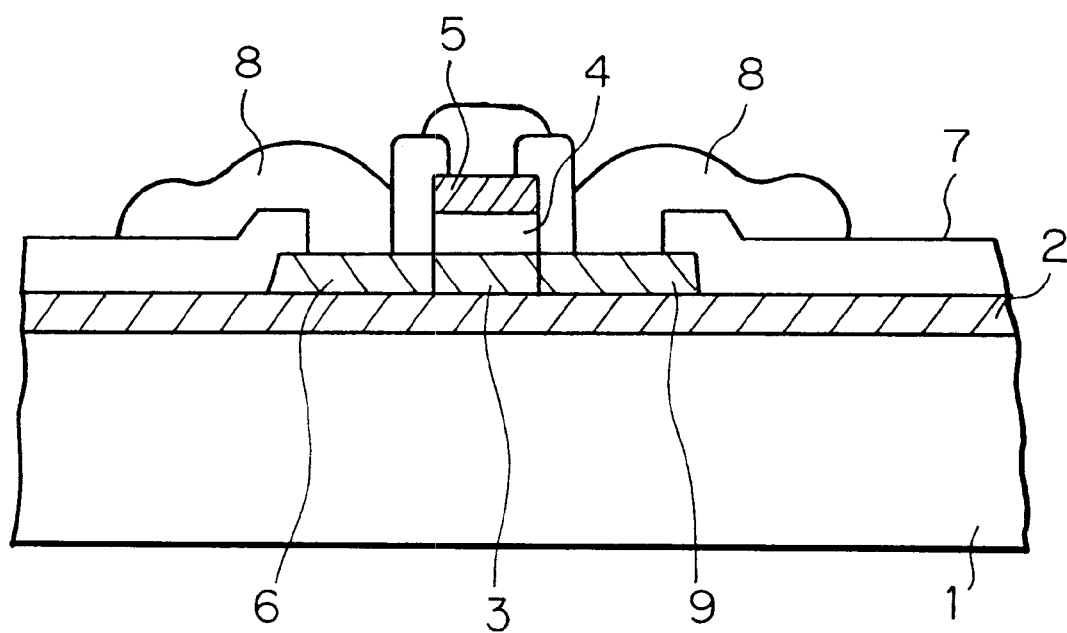
FIG. 1 shows a cross section of a thin film semiconductor device produced through the present invention.

FIG. 1 shows a cross section of a thin film semiconductor device according to the present invention. In the figure, the numeral 1 is a substrate, on which an insulation layer 2 made of $SiO_2$ is placed. Then, on said insulation layer 2, an amorphous silicon layer 3 is produced through a CVD (chemical vapor deposition) process using a silane $Si_nH_{2(n+1)}$ (where n is an integer) and chlorine ($Cl_2$). Then, a gate insulation layer 4 is produced on said layer 3. Also, said amorphous silicon layer 3 is solid phase grown or activated so that crystallized active silicon layer is obtained. A silicon layer 5 is deposited on the gate insulation layer 4 as a gate electrode. The numerals 6 and 9 show a source region and a drain region, 7 is an inter layer layer insulator, and 8 is a doped silicon layer acting as an electrode.

The producing steps of the present thin film semiconductor device are described in reference to FIG. 2.

(1) A substrate 1 is made of glass, for instance a glass which is commercially sold under the trade name 7059 supplied by Corning Co. Ltd. in U.S.A. An insulation layer 2 made of $SiO_2$ is placed on the substrate through a sputter process in a thickness of 1000 Å (FIG. 2(A)).

Figure 2A:
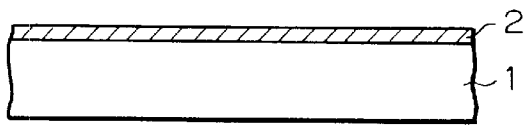
FIG. 2 shows the steps of producing a thin film semiconductor device according to the present invention.
Figure 2B:
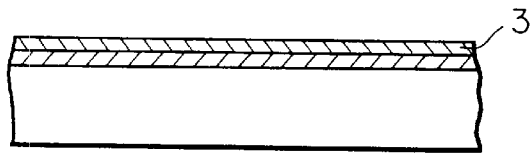

(2) An amorphous silicon layer 3 is deposited on said insulation layer 2 in a thickness of about 2000 Å through a CVD process (FIG. 2(B)).

One set of process conditions for said CVD process is as follows.

| | |
|---|---|
| $SiH_4$ gas | 100 SCCM (Standard Cubic Centimeter per Minute) |
| Pressure | 0.3 Torr |
| $Cl_2$ gas | 1–90 SCCM |
| Temperature | 550° C. |
| Growth rate | 100 Å/minute |

It should be noted that the process temperature (550° C.) is lower than that of the prior art, and the growth rate is higher than in the prior art.

Figure 2C:
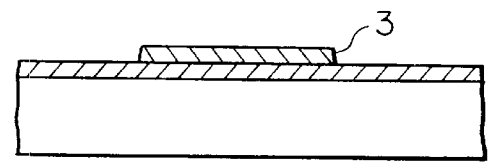

(3) Then, said amorphous silicon layer 3 is patterned to provide an island (FIG. 2(C)).

Figure 2D:
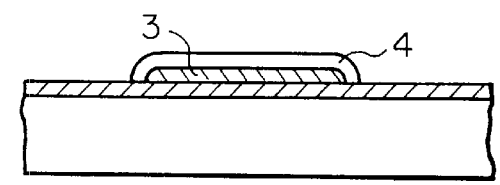

(4) A gate insulation layer 4 is produced on said amorphous silicon layer 3 by oxidizing a part of said amorphous silicon layer 3 (FIG. 2(D)).

The set of process conditions for producing said gate insulation layer 4 is as follows.

| | |
|---|---|
| $H_2$ gas | 4 SLM (Standard Liter per Minute |
| $O_2$ gas | 10 SLM |
| Temperature | 600° C. |
| Process time | 5 hours |

(5) After said gate insulation layer 4 is produced, a solid phase growth process is carried out on said amorphous silicon layer 3 so that said layer 3 is crystallized, or activated.

The set of process conditions for the solid phase growth is as follows.

| | |
|---|---|
| $N_2$ gas | 1 SLM |
| Temperature | 600° C. |
| Process time | 5 hours–20 hours |

It should be noted that the process time is rather short, since the previous process for providing a gate insulation layer (4) contributes also to solid phase growth. Thus, the amorphous silicon layer 3 is converted to an active crystallized silicon layer.

Figure 2E:
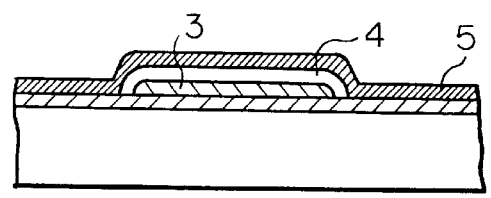

(6) After the gate insulation layer is produced, and the solid phase growth is carried out, a gate electrode, made of a silicon layer 5, is placed on said gate insulation layer 4 through a low pressure CVD process in a thickness of about 2000 Å (FIG. 2(E)). The process condition in this case are similar to the conditions used in the process (2). A dopant like phosphorus may be added in producing the layer 5.

Figure 2F:
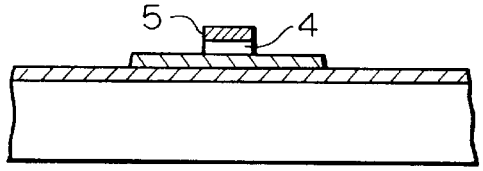

(7) Then, a gate electrode 5 and a gate insulation layer 4 are patterned through an etching process according to a predetermined pattern (FIG. 2(F)).

Figure 2G:
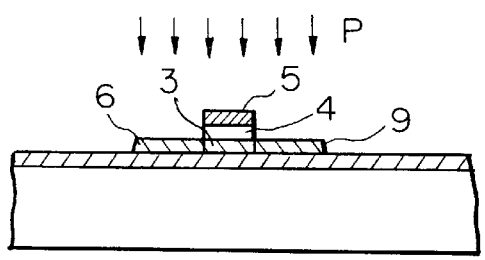

(8) Then, a dopant, for instance phosphorus, is doped into specified regions to form a drain region and a source region of a transistor using as a mask said gate electrode 5 through an ion doping process so that a source region 6 and a drain region 9 are self aligned with the gate electrode (FIG. 2(G)).

(9) Then, said dopant is activated by heating the whole body thus obtained at about 550° C. for about 5 hours in an atmosphere of nitrogen. Then, the whole body is heated in an atmosphere of hydrogen at about 400° C. for 30 minutes for hydrogenation and decreasing trap density of the semiconductor layer.

(10) Then, an inter layer insulation layer 7 of $SiO_2$ is placed on the whole body by using TEOS (tetraethoxy silane) in a thickness of about 4000 Å.

The conditions for producing said $SiO_2$ layer are as follows.

| | |
|---|---|
| TEOS gas | 10–50 SCCM |
| $O_2$ gas | 500 SCCM |
| Power | 50–300 watts |
| Temperature | 400° C. |

Figure 2H:
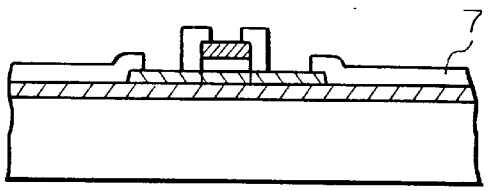

After said $SiO_2$ layer is produced, a patterning process is carried out to produce the necessary shape of wiring for the electrodes, and to shape the inter layer insulation layer 7 (FIG. 2(H)).

(11) Next, another doped silicon layer 8 is produced for an electrode, which is patterned. Thus, a thin film transistor as shown in FIG. 1 is obtained.

In the above step (8), the dopant, phosphorus for an N type transistor, may be replaced by boron for a P type transistor.

The important feature of the present invention is to produce the amorphous silicon layer through a CVD process using a silane $Si_nH_{2(n+1)}$ (when n is an integer) having chlorine ($Cl_2$) added thereto, as mentioned in said process step (2).

The inclusion of chlorine improves the process so that it is carried out at lower temperature and the growth rate of the amorphous layer is higher.

Figure 3:
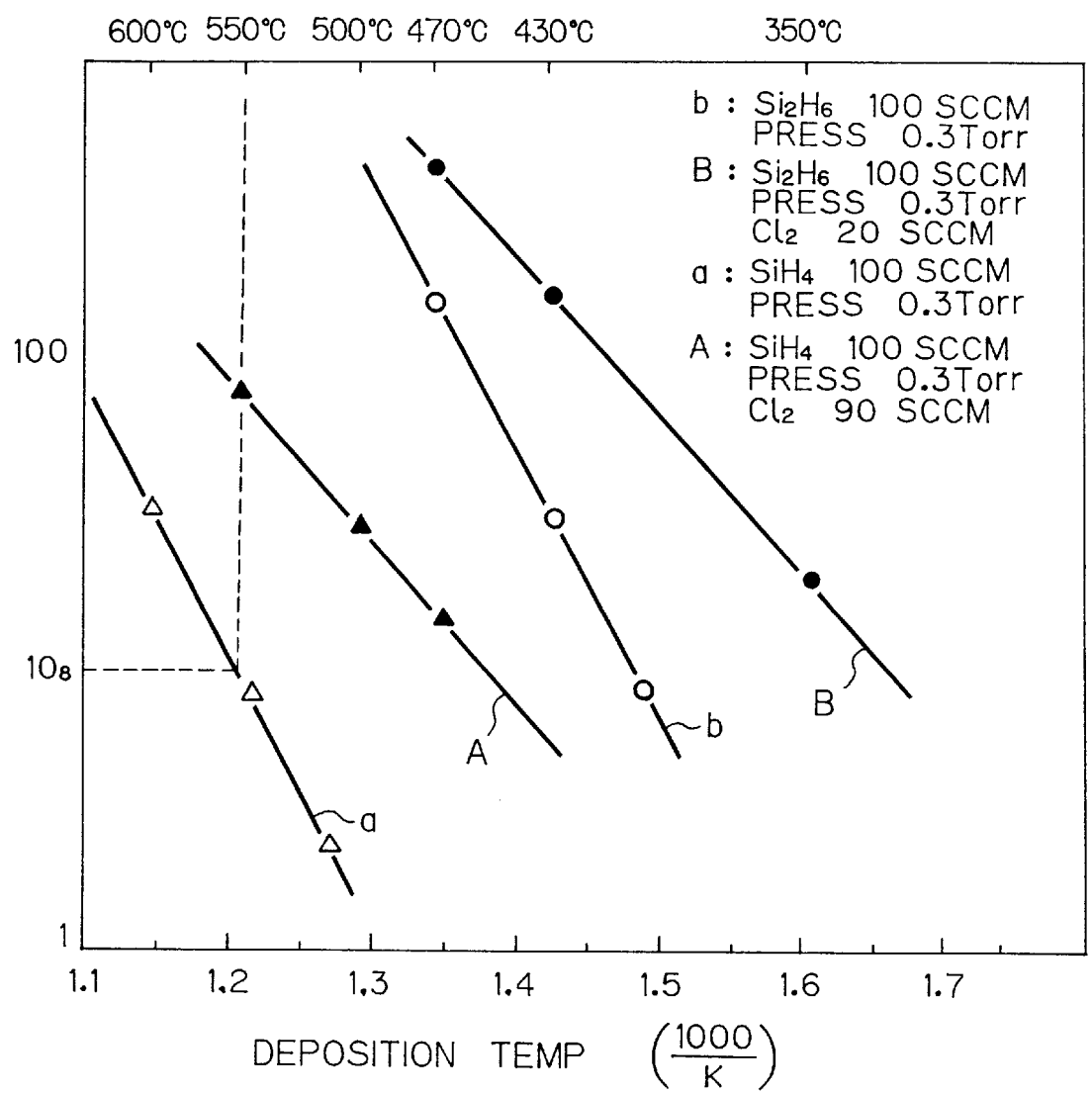
FIG. 3 shows curves relating the deposition temperature to the growth rate of an amorphous silicon layer.

FIG. 3 shows a set of curves relating the deposition temperature (horizontal axis) and the growth rate of the amorphous silicon layer in a logarithm scale in Å/minute on the vertical axis. In the horizontal axis, the values on the lower scale indicate 1000/K, where K is the absolute temperature, and the values on the upper scale indicate ° C.

In FIG. 3, the curve (a) shows the case where the amorphous silicon layer is produced with a gas of $SiH_4$ at a flow rate of 100 SCCM with no addition of $Cl_2$ gas, and pressure is 0.3 Torr. The curve (A) shows the case where chlorine ($Cl_2$) gas is added to the condition in the curve (a) at 90 SCCM. The curve (b) shows the case where the amorphous silicon layer is produced with a gas of $Si_2H_6$ at a flow rate 100 SCCM with no addition of $Cl_2$ gas, and the pressure is 0.3 Torr. The curve (B) shows the case that chlorine ($Cl_2$) gas is added to the case of the curve (b) at a rate of 200 SCCM.

In comparing the curve (a) with the curve (A), the growth rate in case of only $SiH_4$ gas is 8 Å/minute at 550 ° C. (curve (a)), while the growth rate when chlorine gas is added is 100 Å/minute at the same temperature (curve (A)).

Similarly, in comparing the curve (b) with the curve (B) the growth rate in case of only $Si_2H_6$ is 20 Å/minute at 450° C., while the growth rate when chlorine gas is added is 130 Å/minute at the same temperature (curve (B)). Further, at 350° C., the curve (b) shows that no growth of amorphous silicon layer is possible, while the curve (B) shows that the growth is possible at a growth rate of 13 Å/minute.

Figure 4A:
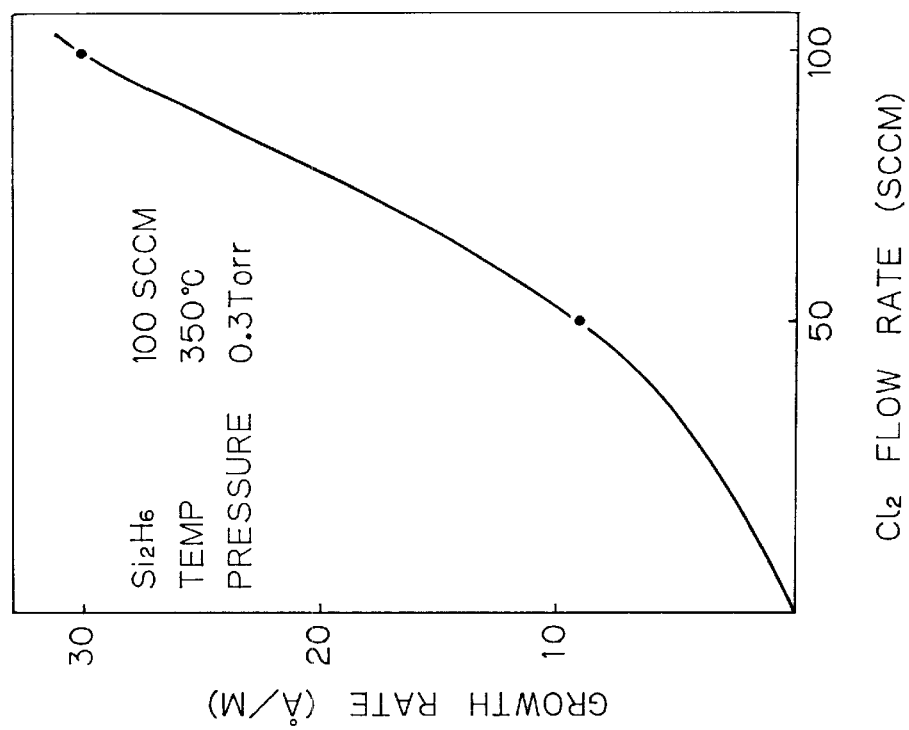
FIG. 4 shows curves relating the flow rate of chlorine to the growth rate of an amorphous silicon layer.

FIG. 4(A) shows the curve relating the flow rate of chlorine gas (horizontal axis) to the growth rate (vertical axis), using $SiH_4$ gas at 100 SCCM, a temperature of 500° C. and a pressure of 0.3 Torr.

Figure 4B:
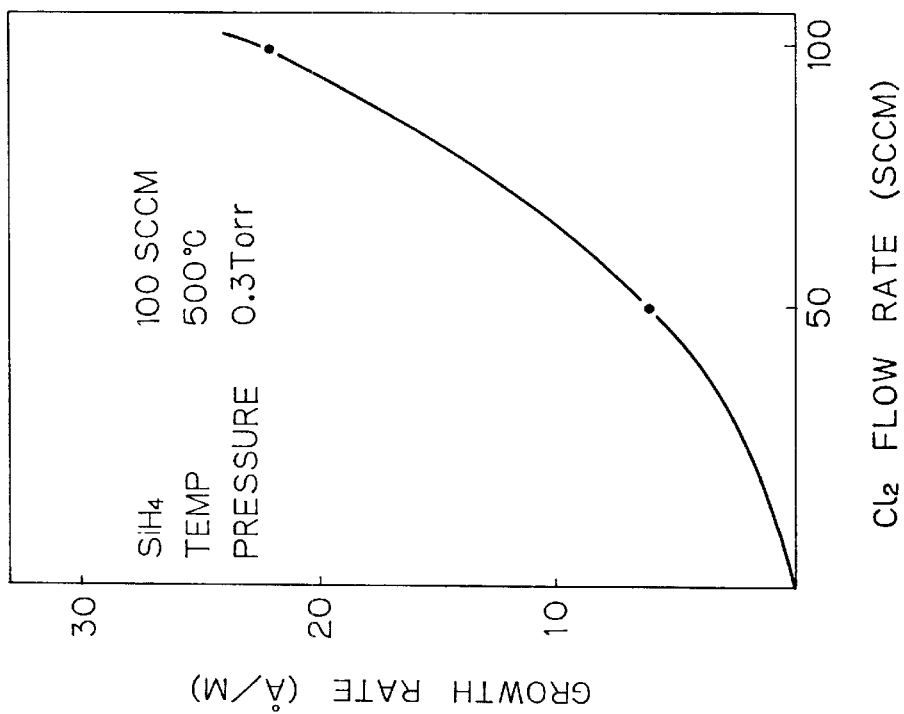

FIG. 4(B) shows the curve relating the flow rate of chlorine gas (horizontal axis) to the growth rate (vertical axis), using $Si_2H_6$ gas at 100 SCCM, a temperature of 350° C. and a pressure of 0.3 Torr.

It should be appreciated from the data in FIG. 4 that the growth rate is increased as the flow rate of chlorine gas is increased. The ratio of increase of the growth rate caused by adding chlorine is even 50–60 times at low temperature as shown in FIGS. 3 and 4.

Figure 5:
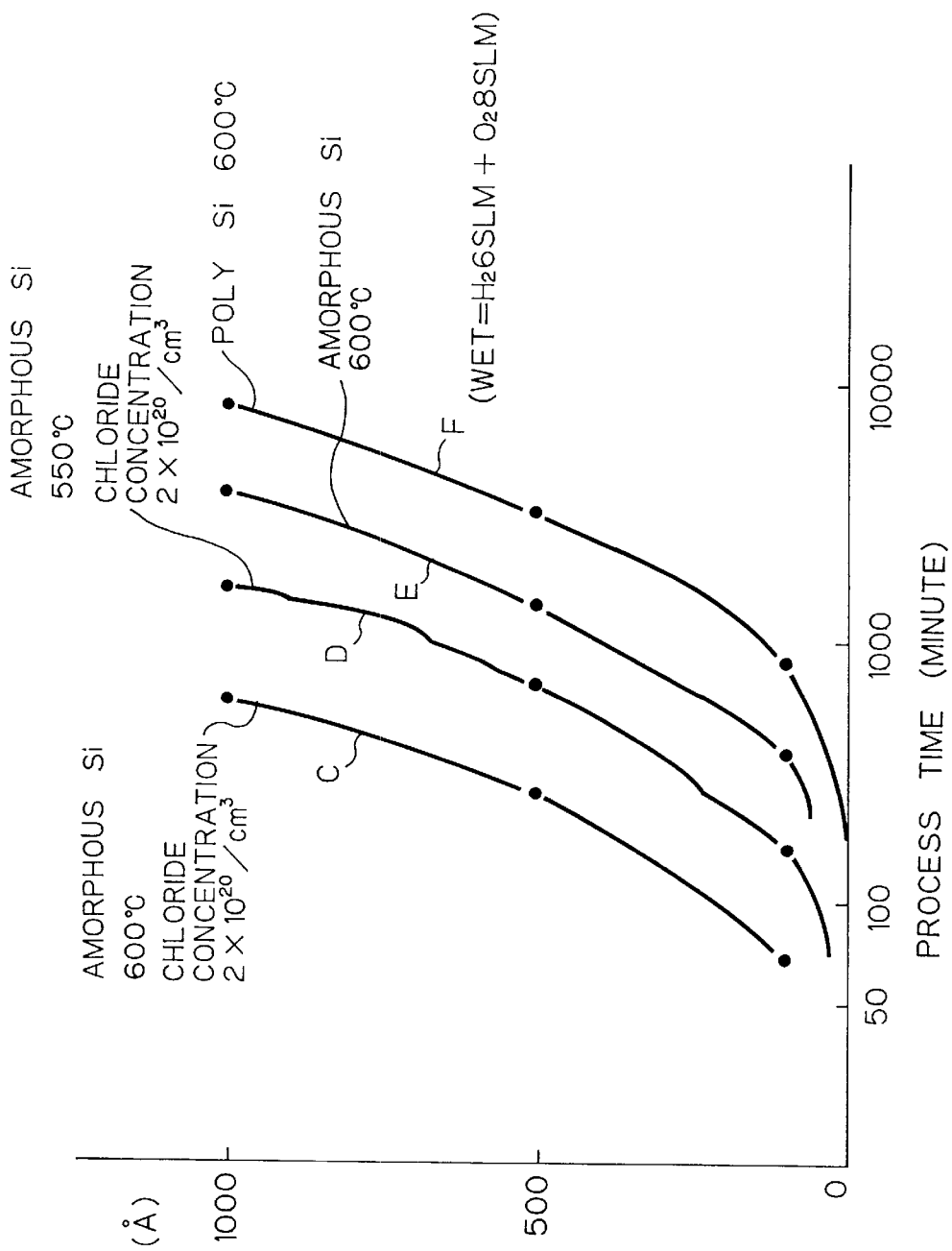
FIG. 5 shows curves relating the time for producing a gate insulation layer and the thickness of the produced gate insulation layer.

FIG. 5 shows curves relating the effect of the presence of chlorine when a gate insulation layer is produced in a wet atmosphere with $H_2$ present at a rate of 6 SLM and $O_2$ present at a rate of 8 SLM. In FIG. 5, the horizontal axis shows process time in minutes and vertical axis shows thickness in Å of the gate insulation film.

The curve (C) in FIG. 5 shows the case where the concentration of chlorine in the amorphous silicon layer is $2\times10^{20}/Cm^3$, and the temperature is 600° C. The curve (D) shows that case where the concentration of chlorine in the amorphous silicon layer is $2\times10^{20}/cm^3$ and the temperature is 550° C. The curve (E) shows that case where no chlorine is included in the amorphous silicon layer and the temperature is 600° C., and the curve (F) shows the case where no chlorine is included in the amorphous silicon layer and the temperature is 600° C.

It should be appreciated in FIG. 5 that the addition of chlorine makes it possible to produce a gate insulation layer at a low temperature at 550° C., and further, it shortens the process time considerably as compared with that shown in curves (E) and (F). Further, it is observed that the threshold voltage of the gate insulation layer is 7 MV/cm, (Mega Volt), which is quite high, and the surface state density is $5\times10^{10}/cm^2$ which is small enough.

In a conventional gate insulation layer produced through a CVD process or a sputter process, it is impossible to produce an excellent surface state density since natural oxide exists on surface of the active silicon layer. The present invention, using thermal oxidation to produce a gate insulation layer, improves said problem. Further, as the thermal process for producing a gate insulation layer also serves as the process for solid phase growth using the thermal process for producing a gate insulation layer shortens the process time for the solid phase growth.

Figure 6:
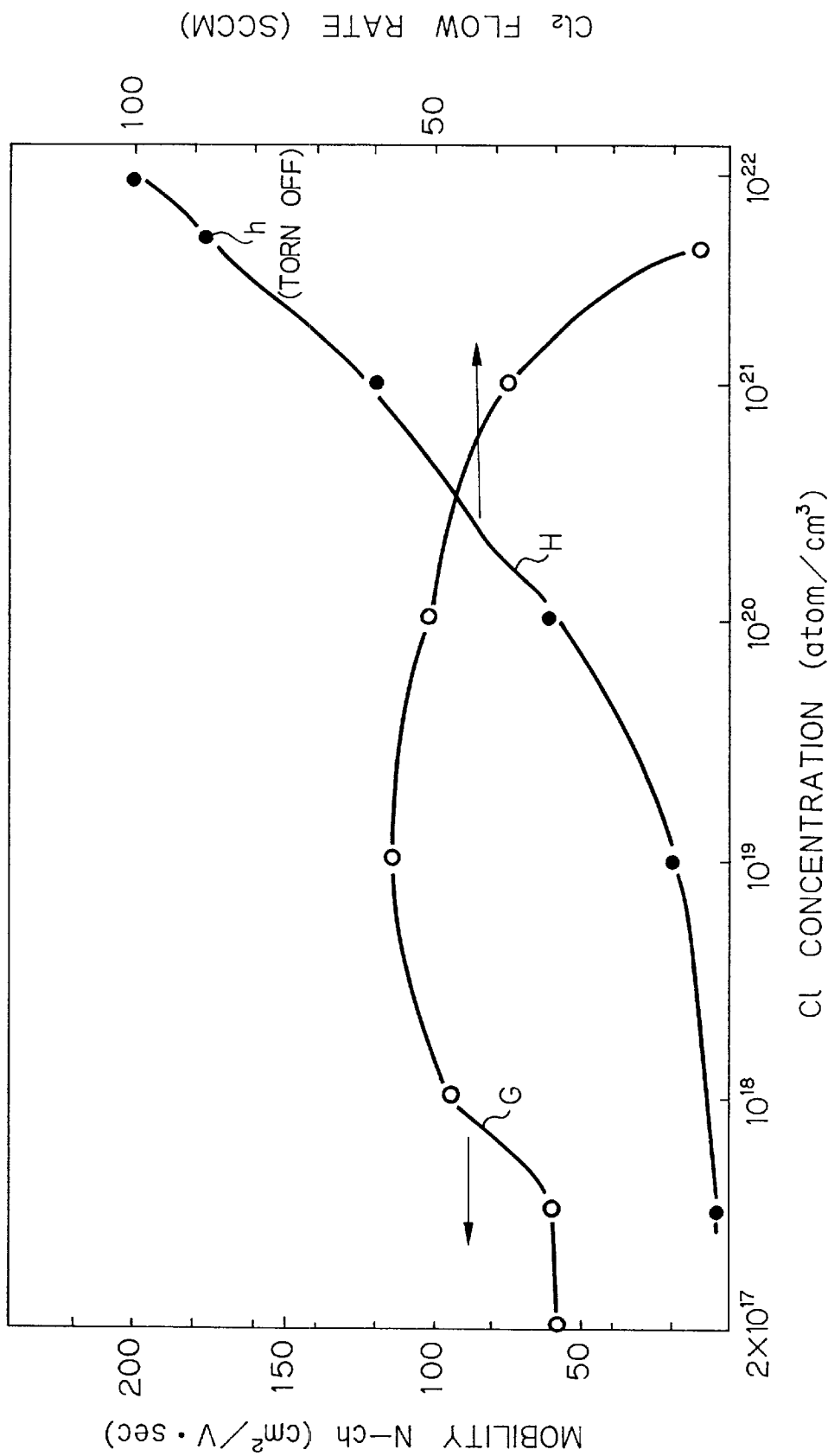
FIG. 6 shows curves relating the flow rate of chlorine and the mobility in a semiconductor device.

In FIG. 6, the curve (G) shows the relations between concentration of chlorine (horizontal axis) in the silicon layer and mobility (vertical axis), and the curve (H) shows the relations between concentration of chlorine (horizontal axis) in the silicon layer and flow rate of chlorine gas. Those curves are obtained in said process (5) at a temperature of 600° C.

As shown in the curve (G), when the concentration of chlorine is low, it does not affect mobility.

As shown in the point (h) of the curve (H), when concentration of chlorine is too high, a layer is torn off during solid phase growth process. Further, when said concentration is too high, no solid phase growth occurs. Therefore, it is preferable that the flow rate of chlorine gas is less than 90 SCCM.

Next, another embodiment of the present invention is described in accordance with FIG. 7, in which amorphous silicon layer is first processed for solid phase growth to provide an active silicon layer, then, an amorphous silicon layer which includes chlorine is produced on said active silicon layer in a process which is similar to said process (2), and then, said amorphous silicon layer is oxidized to provide a gate insulation layer. That process has the advantage that the temperature under which a gate insulation layer is produced is decreased.

The producing steps of the second embodiment are as follows.

(1) A substrate 1 is made of glass, for instance it is commercially obtained under the trade name 7059 supplied by Corning Co. Ltd. in U.S.A. An insulation layer 2 made of $SiO_2$ is placed on the substrate 1 through a sputter process in a thickness of 1000 Å.

Figure 7A:
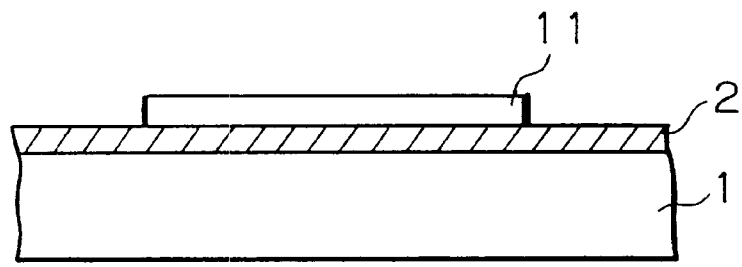
FIG. 7 shows another embodiment of the present invention which is an alternate method of producing a thin film semiconductor device according to the present invention.

An amorphous silicon layer 11 is deposited on said insulation layer 2 at a thickness of about 1000 Å through a LPCVD process (FIG. 7(A)).

The process conditions of said LPCVD process are as follows.

| | |
|---|---|
| $Si_2H_6$ gas | 100–500 SCCM |
| He gas | 500 SCCM |
| Pressure | 0.1–1.0 Torr |
| Temperature | 430–500° C. |

(2) Said amorphous silicon layer 11 is processed for solid phase growth to provide crystallized poly silicon. The process conditions for solid phase growth are as follows.

| | |
|---|---|
| $N_2$ gas | 1 SLM |
| Temperature | 600° C. |
| Process time | 5–20 hours |

Figure 7B:
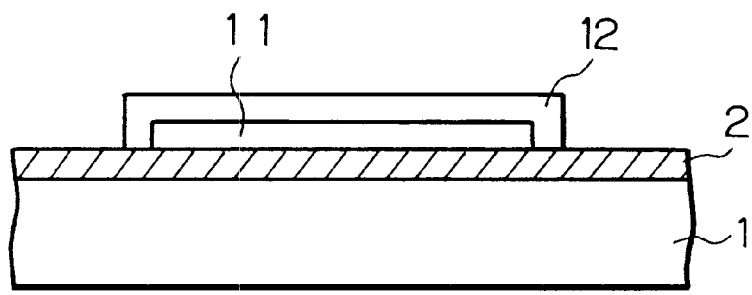

(3) Next, an amorphous silicon layer 12 including chlorine is deposited on said poly silicon layer 11 in a thickness of 1000 Å under the following conditions (FIG. 7(B)).

| | |
|---|---|
| $SiH_4$ gas | 100 SCCM |
| Pressure | 0.3 Torr |
| $Cl_2$ gas | 1–90 SCCM |
| Temperature | 550° C. |
| Growth rate | 100 Å/minute |

Figure 7C:
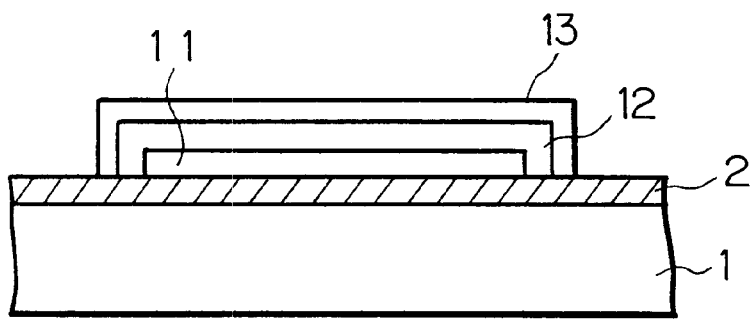

(4) Next, a gate insulation layer 13 is produced by oxidizing the surface of said amorphous silicon layer 12 under the following conditions (FIG. 7(C)).

| | |
|---|---|
| $H_2$ gas | 4 SLM |
| $O_2$ gas | 10 SLM |
| Temperature | 550° C. |
| Process time | 8 hours |

It should be noted that the process temperature 550° C. is lower than the temperature 600° C. in the process step (4) in the first embodiment.

The following processes are similar to those in the first embodiment, and a thin film transistor (TFT) is obtained.

In the above embodiments, glass is used as a substrate, but quartz crystal is also used as a substrate. In the present invention, when concentration of chlorine is less than $1\times10^{17}$ atom/cm$^3$, no improvement of the characteristics of a thin film transistor is obtained. When the concentration of chlorine is higher than $5\times10^{21}$ atom/cm$^3$, no solid phase growth is possible and further a layer is torn off. Therefore, the preferable range of chlorine in the amorphous silicon layer is from $1\times10_{17}$ atom/cm$^3$ to $5\times10^{21}$ atom/cm$^3$.

As for concentration of C, O, and N in the amorphous silicon layer, each must be less than $5\times10^{18}$ atom/cm$^3$, since when each is larger than that figure, large crystal grains are not obtained.

The application of the present invention is not limited to a thin film transistor, but the present invention may be used in a solar battery.

Further, the present invention has the advantage that the producing process may be carried out in a dielectric chamber, for instance, a quartz chamber, but not a conductive chamber.

As mentioned above in detail, the present invention provides a silicon layer as an active layer of a thin film transistor at a rapid growth rate, and at a low temperature for producing a gate insulation layer, and provides a thin film transistor with high mobility, low threshold voltage, high operational reliability, and low producing cost. Further, according to the present invention, high pressure is not requested for producing a gate insulation layer, but normal pressure is enough.

From the foregoing, it will now be apparent that a new and improved thin film semiconductor device has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A method of producing a thin film semiconductor device, comprising the steps of introducing chlorine gas and a gas comprising a silane into a deposition chamber;

under low pressure conditions, reacting said chlorine gas and said gas comprising said silane together on a substrate surface to deposit an amorphous layer comprising amorphous silicon and chlorine on said substrate surface, wherein the concentration of chlorine in said amorphous layer is $1\times10^{17}$ to $5\times10^{21}$ atom/cm$^3$;

producing a gate insulation layer on said amorphous layer by oxidizing a surface of said amorphous layer, wherein the concentration of chlorine in said gate insulation layer is $2\times10^{17}$ to $2\times10^{21}$ atom/cm$^3$;

heating said substrate surface having said amorphous layer deposited thereon to effect solid phase growth to said amorphous layer to produce an activated layer comprising crystallized silicon and chlorine;

producing a gate electrode on said gate insulation layer;

producing a drain region and a source region in said activated layer; and producing a source electrode contacting said source region and a drain electrode contacting said drain region, to produce a thin film semiconductor device.

2. The method of claim 1, wherein in said reacting step said chlorine gas has a flow rate of less than 90 SCCM, and said reacting step is carried out at a temperature of about 550° C.

3. The method of claim 1, wherein in said reacting step said chlorine gas has a flow rate of greater than 20 SCCM.

4. The method of claim 1, wherein the method is carried out in a dielectric chamber.

5. The method of claim 1, wherein said silane comprises $SiH_4$.

6. The method of claim 1, wherein said silane comprises $Si_2H_6$.

7. A method of producing a thin film semiconductor device, comprising the steps of under low pressure conditions, reacting a gas comprising di-silane on a substrate to deposit a first amorphous layer comprising amorphous silicon on said substrate;

heating said substrate having said first amorphous layer deposited thereon to effect solid phase growth to said amorphous layer to produce an activated layer comprising crystallized silicon;

reacting a $Cl_2$ gas and a gas comprising a silane having the formula $Si_nH_{2(n+1)}$ wherein n is an integer, together on said activated layer to deposit a second amorphous layer comprising amorphous silicon and chlorine on said activated layer, wherein the concentration of chlorine in said second amorphous layer is $1\times10^{17}$ to $5\times10^{21}$ atom/cm$^3$;

producing a gate insulation layer on said second amorphous layer by oxidizing a surface of said second amorphous layer;

producing a gate electrode on said gate insulation layer;

producing a drain region and a source region in said activated layer; and producing a source electrode contacting said source region and a drain electrode contacting said drain region, to produce a thin film semiconductor device.

8. The method of claim 7, wherein said silane comprises $SiH_4$.

9. The method of claim 7, wherein said silane comprises $Si_2H_6$.

* * * * *